(12) United States Patent
Hamlin

(10) Patent No.: US 7,322,021 B2
(45) Date of Patent: Jan. 22, 2008

(54) VIRTUAL PATH FOR INTERCONNECT FABRIC USING BANDWIDTH PROCESS

(75) Inventor: Christopher L. Hamlin, Los Gatos, CA (US)

(73) Assignee: LSI Logic Corporation, Milpitas, CA (US)

( * ) Notice: Subject to any disclaimer, the term of this patent is extended or adjusted under 35 U.S.C. 154(b) by 1254 days.

(21) Appl. No.: 10/285,301

(22) Filed: Oct. 31, 2002

(65) Prior Publication Data

US 2004/0088668 A1    May 6, 2004

(51) Int. Cl.
*G06F 17/50* (2006.01)
(52) U.S. Cl. ............................................. 716/12; 716/2
(58) Field of Classification Search .................... 716/1, 716/2, 8, 12, 14
See application file for complete search history.

(56) References Cited

U.S. PATENT DOCUMENTS

| | | | |
|---|---|---|---|
| 5,596,742 A | 1/1997 | Agarwal et al. | 395/500 |
| 5,752,070 A | 5/1998 | Martin et al. | 395/800.33 |
| 5,761,484 A | 6/1998 | Agarwal et al. | 395/500 |
| 5,898,677 A | 4/1999 | Deeley et al. | 370/276 |
| 6,152,613 A | 11/2000 | Martin et al. | 395/800.33 |
| 6,269,277 B1 | 7/2001 | Hershenson et al. | 700/97 |
| 2002/0152305 A1* | 10/2002 | Jackson et al. | 709/224 |

OTHER PUBLICATIONS

"Self-Reconfigurable Programmable Logic Device" by Reetinder Sidhu, et al.; File # 3115; University of Southern California, Office of Technology Licensing, Los Angeles, CA; www.usc.edu/academe/otl; Sep. 7, 2001.

"Sea-of-IP: An Ocean of Design Possibilities", Royal Phillips Electronics; Philips Semiconductors—Technology Home Pages; Sea-of-IP.

"Tensilica Navigates 'Sea of Processors' Designs" by Chris Edwards; *Electronics Times*; Jun. 14, 2001; www.eetimes.com., News Channels Semiconductors.

"On-Chip Networks Weighed as Wiring Alternative" by Ron Wilson, *Integrated System Design*, Jun. 25, 2001; www.eetimes.com. , News Channels Design Automation.

"Configurable Computing" by John Villasenor et al., Scientific American, Jun. 1997; www.sciam.com/0697issue/0697villasenor.html; Apr. 19, 2002.

"Simplify programmable-logic-IP integration" by Robert Cravotta, EDN Access, Apr. 11, 2002; www.e-insite.net/edn...x.asp?layout=article&articleId=CA207117; Apr. 30, 2002.

"Altera casts spotlight on IP integration tool" by Crista Souza, EBN, Mar. 7, 2002; www.ebnews.com/story/OEG20020307S0018; Apr. 30, 2002.

* cited by examiner

*Primary Examiner*—Thuan Do
(74) *Attorney, Agent, or Firm*—Suiter Swantz PC LLO

(57) ABSTRACT

The present invention pertains to a system and method for specifying links, connectivity and bandwidth in an interconnect fabric. For example, a method for allocating connectivity and bandwidth of an integrated circuit may include receiving an interconnect fabric description, the described interconnect fabric having a plurality of platforms linked over an isochronous interconnect fabric. An arrangement of links of the received interconnect fabric is virtualized based on bandwidth. An arrangement of links of the received interconnect fabric is virtualized based on connectivity. The links are allocated on the basis of the virtualized link arrangements based on bandwidth and connectivity.

24 Claims, 3 Drawing Sheets

VIRTUAL PATH FOR INTERCONNECT FABRIC USING BANDWIDTH PROCESS

CROSS REFERENCE TO RELATED APPLICATIONS

The present application hereby incorporates the following U.S. patent applications by reference in their entirety:

| Attorney Docket Number | Express Mail L.N./U.S.P.N. | Filing Date |
|---|---|---|
| LSI 01-390 | 10/015,194 | Nov. 20, 2001 |
| LSI 01-488 | 10/021,414 | Oct. 30, 2001 |
| LSI 01-489 | 10/021,619 | Oct. 30, 2001 |
| LSI 01-490 | 10/021,696 | Oct. 30, 2001 |
| LSI 01-524B | 10/044,781 | Jan. 10, 2002 |
| LSI 01-543 | 10/135,189 | Apr. 30, 2002 |
| LSI 01-695 | 09/842,335 | Apr. 25, 2001 |
| LSI 01-827 | 10/034,839 | Dec. 27, 2001 |
| LSI 01-828B | 10/061,660 | Feb. 1, 2002 |
| LSI 02-0166 | 10/135,869 | Apr. 30, 2002 |
| LSI 02-0560 | EV 087 433 682 US | Jun. 27, 2002 |
| LSI 02-4372 | EV 087 433 696 US | Jun. 27, 2002 |
| LSI 02-0383 | EV 087 433 461 US | Jul. 31, 2002 |
| LSI 02-4466 | EV 087 433 461 US | Jul. 31, 2002 |

FIELD OF THE INVENTION

The present invention generally relates to the field of integrated circuit design, and particularly to virtualization of integrated circuit resources for resource allocation and optimization.

BACKGROUND OF THE INVENTION

Integrated circuits (IC) have become an important aspect in an ever increasing array of devices. From network storage systems to wireless phones, integrated circuits are relied upon to provide the functionality desired by this wide range of devices. To meet this range of uses, the integrated circuit may be designed specifically to meet a contemplated need, as well as designed to provide functionality desired in a wide range of instances. The types and functionality desired in integrated circuits is almost limitless.

Thus, integrated circuits have become a necessary part of a diverse range of everyday modern society. To provide this functionality, integrated circuits may need to be specialized to have the functions necessary to achieve the desired results, such as through the provision of an application specific integrated circuit (ASIC). An ASIC is typically optimized for a given function set, thereby enabling the circuit to perform the functions in an optimized manner. However, there may be a wide variety of end-users desiring such targeted functionality, with each user desiring different functionality for different uses.

Additionally, more and more functions are being included within each integrated circuit. While providing a semiconductor device that includes a greater range of functions supported by the device, inclusion of this range further complicates the design and increases the complexity of the manufacturing process. Further, such targeted functionality may render the device suitable for a narrow range of consumers, thereby at least partially removing an "economy of scale" effect that may be realized by selling greater quantities of the device.

Therefore, there is a need for a system and method that may optimize both specialized and general purpose integrated circuits that will address the increased functional count and diverse functionality of the integrated circuits that may be encountered.

SUMMARY OF THE INVENTION

Accordingly, the present invention is directed to a system and method for virtualizing links in an interconnect fabric having a plurality of platforms. In a first aspect of the present invention, a system comprises a plurality of platforms communicatively coupled utilizing an interconnect fabric and a program of instructions suitable for being performed by the plurality of platforms. The program of instructions configures the plurality of platforms to aggregate bandwidth between platforms.

In an additional aspect of the present invention, a method for allocating connectivity and bandwidth of an integrated circuit includes receiving an interconnect fabric description, the described interconnect fabric having a plurality of platforms linked over an isochronous interconnect fabric. An arrangement of links of the received interconnect fabric is virtualized based on bandwidth. An arrangement of links of the received interconnect fabric is virtualized based on connectivity. The links are allocated on the basis of the virtualized link arrangements based on bandwidth and connectivity so that connectivity of the fabric is distributed independently of the bandwidth of the fabric.

In a further aspect of the present invention, a method for allocating connectivity and bandwidth of an integrated circuit includes receiving an interconnect fabric description, the described interconnect fabric having a plurality of platforms linked over an isochronous interconnect fabric. An arrangement of links of the received interconnect fabric is virtualized based on bandwidth. An arrangement of links of the received interconnect fabric is virtualized based on connectivity. The links are allocated on the basic of the virtualized link arrangements based on bandwidth and connectivity.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Figure 1:
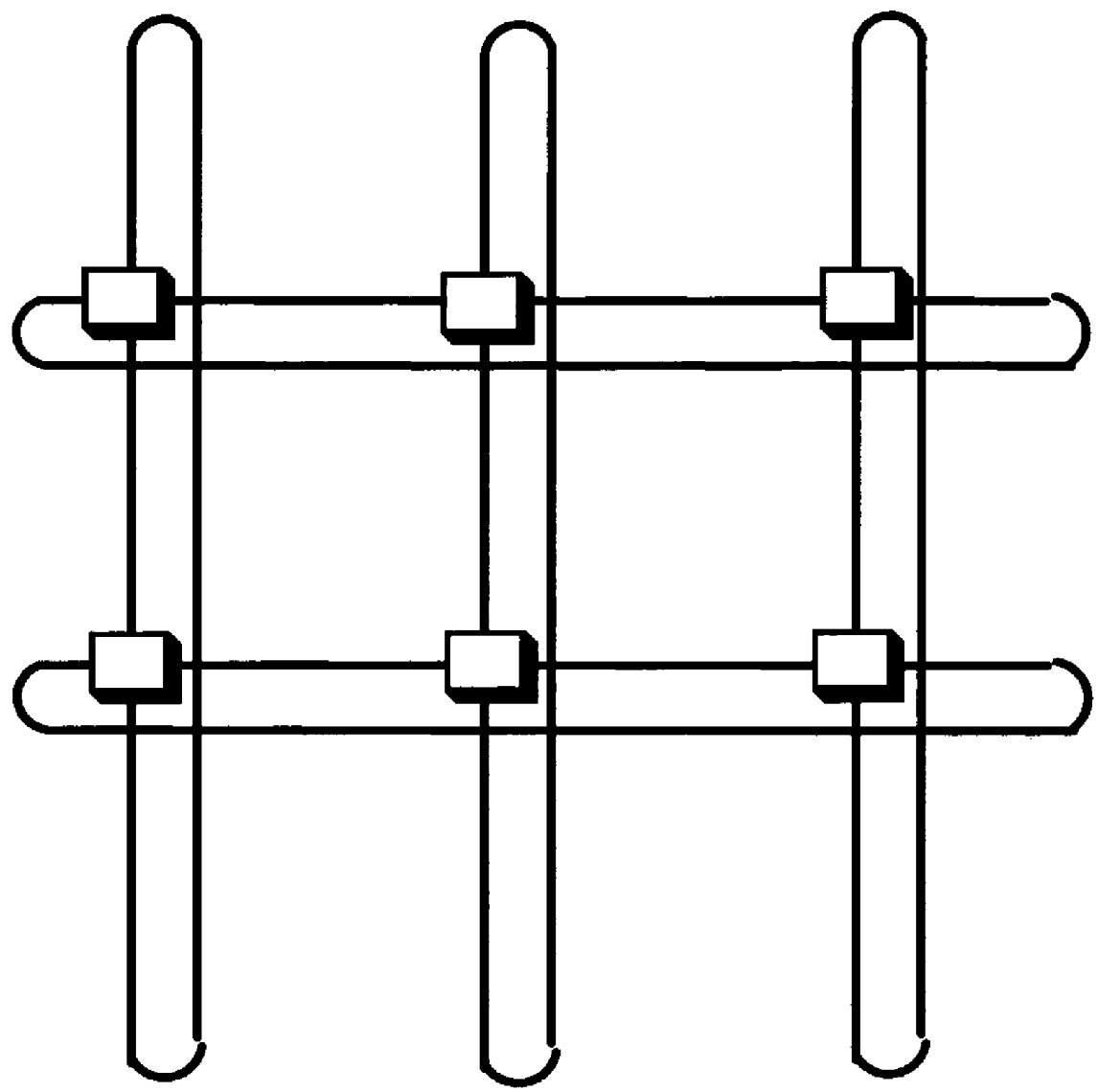
FIG. 1 is a block diagram of an exemplary embodiment of the present invention wherein an arrangement of platforms in a taurus is shown.
Figure 2:
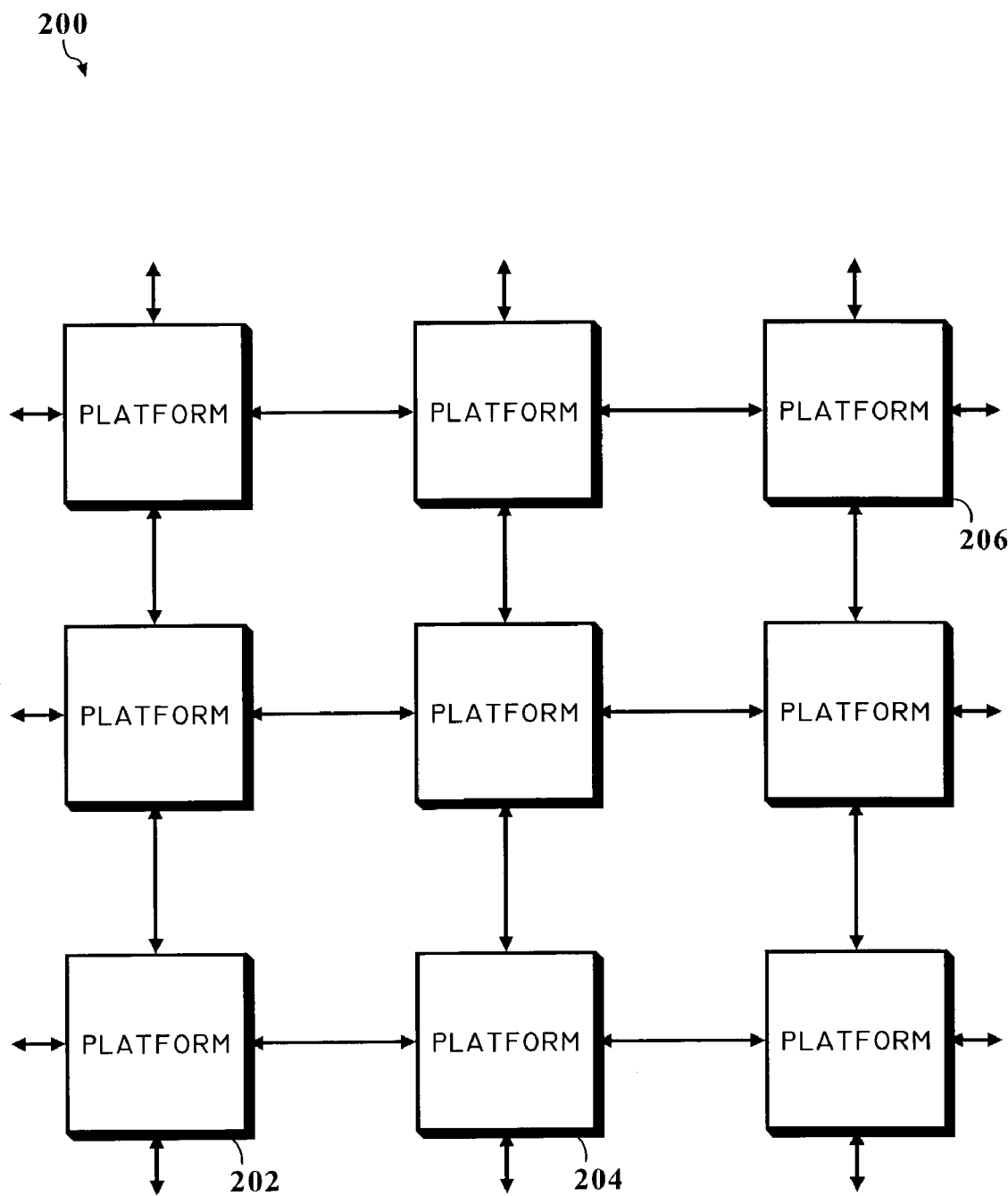
FIG. 2 is a diagram of an exemplary embodiment of the present invention wherein a plurality of platforms are shown, the platforms in an interconnect fabric.
Figure 3:
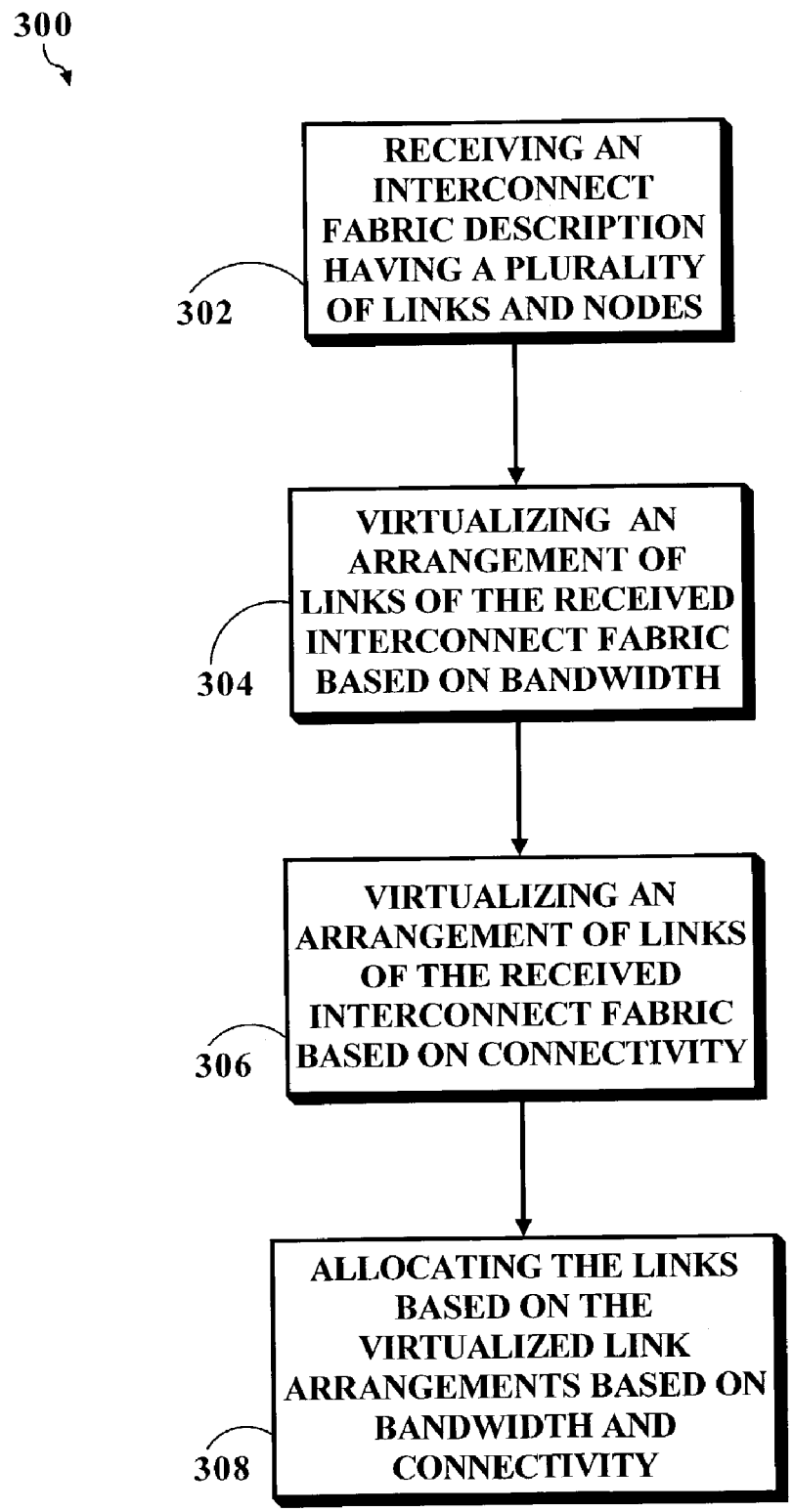
FIG. 3 is a flow diagram depicting an exemplary method of the present invention.

Referring generally now to FIGS. 1 through 3, exemplary embodiments of the present invention are shown. One way of organizing a chip internally with respect to both internal and external resources is to incorporate the components into what may be called a switching fabric, where resources might exist at what are referred to as "nodes" within the device. The nodes may be connected by a set of links, i.e. the wires between the nodes, and these, in turn, form a regular structure, which is called a fabric, which may be connected in loops or the like. For instance, a fabric may be formed having a two-dimensional structure which is looped around at the ends, that logically forms a taurus, an example of which is shown in FIG. 1.

Another fabric has been described in copending application Ser. No. 10/044,781, filed Jan. 10, 2002, which was incorporated by reference in its entirety. In particular, the application describes a "Sea of Platforms", and in an embodiment described, each node is a platform comprising a processor, an FPGA block and memory block, a reconfigurable core and the like, in a regular pattern.

The present invention addresses a variety of aspects, and specifically three aspects, of the characteristics of the fabric itself, and in particular, the allocation of resources within the switching fabric. In one embodiment, it may be assumed that at each node in a switching fabric, a switch is provided which operates to direct traffic within the switching fabric. The switch may be separate and apart from the platform that also exists at the node. Traffic into and out of the node may be controlled by the behavior of the switch.

The allocation problem has to do with how scarce resources within the chip and, more particularly, within the fabric are allocated between the links and nodes, and the bandwidth that is required. For instance, for a particular function that is implemented using a chip that is organized in the form of a switching fabric, it may be determined that, for functional reasons, one particular node had a requirement that it be particularly richly connected to a large number of other nodes because of the function that the node is fulfilling. For example, a particular node could be required to have simultaneous connectivity that went quite far afield in the chip.

Therefore, in some instances, the surrounding nodes may need to know whether the node is a pass-through node, or not. The traffic in the fabric, for instance, may not be limited to physically contiguous nodes, but rather may logically implicate far-reaching nodes in many cases. Thus, there is a problem of how the links and the nodes are allocated.

In further cases, situations may also be encountered where the bandwidth should be allocated as well. For example, as shown in the embodiment 200 depicted in FIG. 2, a case may be encountered in which a first node 202 and a second node 204 are closely connected for functional reasons but have limited bandwidth between each other, while a node 206 further apart in the fabric may require greater bandwidth with the first node 202. Thus, the three allocation problems of how to optimally allocate links and nodes and bandwidth form a key problem in the design and specification of switching fabrics. Through use of the present invention, the resources of the chip may be "virtualized" in a sense for optimization of the circuit design.

For instance, as shown in FIG. 2, each link between nodes in a switching fabric may actually have four physical wires capable of sustaining some particular bandwidth, so the peak bandwidth that is possible to construct between any two nodes would be four-in. Thus, in a first instance, it may be required that the bandwidth between two nodes be two-in; that is, twice the maximum bandwidth that one wire is capable of supporting.

There may be a large number of ways to provide the desired bandwidth. By virtualizing the allocation problem, a number of different solutions may be examined. For example, by obtaining two-in bandwidth, but not necessarily having the same pair of wires in parallel going to each node, such as by utilizing isochronous switching that connects the nodes. In other words, by having regularly-timed, regularly-clocked transitions on all of the physical wires in the fabric at once, solution flexibility is provided.

One reason that this solution is attractive is that it offers an additional degree of freedom in allocating the links in the switching fabric with respect to how the links contribute to satisfying the bandwidth requirements between any two nodes.

Another interesting aspect of the virtualization of the present invention is that the bandwidth requirements between the nodes may vary with time, so that, in effect, the allocation in a previous instance may be discarded and reallocated to a different set of links in a second episode. This may be, in turn, a function of all of the other traffic that is present on the fabric at that particular instant of time.

Being able to dismantle the actual wires between nodes in the way previously described so that the individual wires may be allocated to managing traffic in a particular way is attractive in the sense that it offers additional degrees of freedom.

In some encountered embodiments, this may require additional overhead because there may be additional circuitry that is required in each switch and/or in each node, which will decide which transmission process that particular physical wire is implicated in at that particular time. However, this may be a function of the isochronous protocol devised to manage the traffic on the individual physical links, which is set up and affiliated with one another. Thus, the protocol may become an integral means of implementing a scheme of this kind.

The present invention addresses the problem of bandwidth allocation by completely virtualizing the allocation of links. Therefore, the present invention provides the functionality of management of the switching fabric on the device, including associating nodes with one another. Preferable, the present invention may satisfy node bandwidth requirements by literally any set of paths connecting individual wires, and include distant paths to "remote" portions of the chip. For instance, the links may be virtualized in such a manner as to be mathematically described so that routes may be chosen in the chip utilizing any of a number of desired algorithms. With a suitably-chosen protocol, through use of the present invention, an isochronous fabric is capable of sustaining that set of discrepant leaps over the links in the fabric.

For example, referring now to FIG. 3, an exemplary method 300 of the present invention is shown wherein an allocation of resources in a fabric is performed based on bandwidth and connectivity. An interconnect fabric description having a plurality of links and nodes is received 302. An arrangement of links of the received interconnect fabric is virtualized based on bandwidth 304 and is also vitualized based on connectivity 306. The links of the fabric and then allocated based on the virtualized arrangements of connectivity and bandwidth 308. In this way, a designer may take this discrepant mapping as virtualized and bring it back into co-incidence so that optimal allocations may be made.

In particular, the present invention provides deterministic control over the number of clock cycles required to provide simultaneous arrival of all the constituent elements in a piece of data being transmitted over the bandwidth utilizing an isochronous signal with a suitable isochronous protocol managing the whole thing. For example, suppose a designer is concerned with bandwidth and traffic between two particular nodes. From a formal, purely abstract point of view, such as a mathematical point of view, the set of all possible individual wires connecting to a group may be viewed in a sort of "traveling salesman" problem. Thus, the query may be, of that set of all possible single wires following all possible sets of paths, which wires are available to in light of the currently prevailing traffic model that is being supported by the switching fabric at a particular instant in time. Current methodology and protocols do not permit that virtualization of the physical links to that degree, and effectively, it is not possible in the absence of the present invention.

In effect, this puts a constraint on the "traveling salesman" problem and makes it more manageable. There are further constraints that may be imposed on this problem in order to make it calculable with polynomial time algorithms.

The present invention offers flexibility of aggregation of links so that the bandwidth between nodes may be greater than otherwise possible. For instance, the present invention may take advantage of a set of wires, such as the four wires shown between each node in FIG. 2. Through use of the present invention, the wires located between each node need not be implicated and devoted to traffic between neighboring nodes, but rather may be allocated to distant nodes. For example, rather than being devoted to traffic between a first and second neighboring node, the wires may be allocated between remote nodes. Such allocation may be provided through algorithmic and/or deterministic data that indicates the usage of the wires in the path. For instance, it may be determined that wires in a path, at a particular point in time, are not involved in traffic between neighboring nodes. Therefore, the wires are free to be allocated to satisfy other resource requires of the fabric.

It should be noted that this aspect of the present invention provides the capability of assembling paths that have greater bandwidth than four physical wires are capable of supporting in the present example. In other words, sets of wires may be aggregated between pairs of nodes that would support greater bandwidth. Thus, bandwidth may be scaled beyond the physical limitations of the particular physical links in the fabric.

This may have the effect in certain embodiments of a fabric, of reducing the ability of the fabric to support richness and connectivity. Therefore, there may be a continuous trade-off between richness and connectedness and the ability to support peak aggregate bandwidth, which may be addressed as desired by the present invention. In this way, the present invention provides increased flexibility by allowing a designer to optimize the structure based on these considerations.

Additionally, an upper bound may be imposed, such as a threshold, on the ability of the fabric to aggregate links in satisfaction of bandwidth requirements to ensure that the problem is solvable in an efficient manner utilizing the resources of the fabric.

Another important area is the question of imposing upper bounds on the amount of aggregation that is supported in any particular fabric. In other words, the upper bound on the amount of aggregation that is permitted may be closely tied to the upper bound or the dimensionality of the fabric. For instance, referring back to the two-dimensional taurus of FIG. 1, even hyper-tauri that have four, five, six and more dimensions may be supported by the fabric. With higher-dimensional spaces, the aggregation possibilities are greater because the richness of the connectivity is greater. The higher-dimensional connectivity possibilities will become more important in mapping and controlling high-complexity devices as component count increases. In other words, where instead of hundreds of thousands and millions of gates are encountered; a designer in the near future may have billions of gates. Thus, the present invention provides a way of beginning the next plateau in attacking the problem of scaling billion-gate designs. In this way, the present invention may provide higher bandwidths through aggregation than would otherwise be supported between nodes of the fabric The present invention also provides for decomposition of the link structure in satisfaction of bandwidth allocation in support of the other problem encountered by designers, which has to do with how nodes and bandwidth are treated. A fabric may have connectivity in the node that follows a power-law distribution.

For example, one of the things determined about these networks through investigation of the present invention, can be summarized in a simple way, in that, in large, complex networks, like the Internet, as well as in much simpler networks, it is often the case that a small number of nodes account for most of the connectivity. In other words, most of the connections are made to a small number of nodes, and follow a power-law decay, while the vast bulk of nodes have, correspondingly, relatively few connections and links to them. That is opposed to a Gaussian distribution, which, in many cases, previously had been assumed to be the case for how node connectivity is distributed in networks.

This has an important implication to the design of chips, because to govern a chip that is employing a switching fabric, situations may be encountered in which a few of the nodes handle the vast amount of connectivity. While it should be realized that there may be instances in which this is not encountered, through use of the present invention, the situations may be determined and addressed to improve the efficiency and performance of the fabric and chip.

Connectivity is only one aspect of the sort of differential density that the chip is encountering. The other aspect is the bandwidth requirement, and notice that the bandwidth requirement is completely independent of the physical connectivity, per se. In other words, a first node and a second node may have explicit connectivity to most of the other nodes in the network, but that does not necessarily imply that the bandwidth that is supported by the nodes is also equivalently distributed with the connectivity.

Thus, if instead of being perfectly matched so that connectivity and the bandwidth correspond to the same set of nodes, bandwidth and connectivity may be configured to be discrepant. Therefore, in implementation, connectivity may observe a power-law distribution with respect to one set of nodes, but bandwidth may observe a power-law distribution with respect to a different set of nodes. The disaggregation of links, i.e. the ability to allocate links at will between sets of nodes, allows a designer to take this discrepant mapping and bring it back into co-incidence so that optimal allocations may be made, according to a virtualized connectivity and bandwidth rule. This has the effect of maximizing the use of the resources in the device. Bandwidth allocation, which in some instances is extremely skewed, that is, it is asymmetrical with respect to the number of nodes that it involves, and connectivity, which may follow, arguably, a power-law distribution, even though it is not the same set of nodes that is involved, by virtualizing the links, in the way as previously described, so that the links themselves may be allocated accordingly. Thus, the present invention may address those two sets of distributions and draw them into co-incidence.

For example, referring now to FIG. 3, an exemplary method of the present invention is shown wherein virtualization of links in a switching fabric is utilized to optimize fabric functionality through both bandwidth allocation and connectivity.

The present invention provides a set of algorithmic procedures for measuring the distributions, the independent distributions of connectivity of links and bandwidths within a switching fabric and then reallocating disaggregated link structures independently so as to bring those two distributions into conjunction with one another. In this way, an optimal allocation of resources is provided, such as the physical resources within the switch based on a switching fabric.

There are a variety of ways of determining which nodes are the high traffic nodes. For example, one is by sampling, in which, usage is to be measured and detected and the high-traffic nodes inferred from the actual behavior. Another technique is that the determination may be performed parametrically by design. In actual use, both methods may be utilized. Optimization may be superior to the extent that both techniques are used; that is, by design, a designer may specify parametrically, estimates of bandwidth allocation and then measure the degree of which actual usage pattern deviates.

Additionally, the allocation that was described earlier, in which the individual link wires were disaggregated, e.g. the physical entities that connect nodes together, that algorithm may actually be applied dynamically and may be used to assign bandwidth on a dynamic basis as conditions vary within a switching fabric. Even though some changes may be made in what was previously considered a "dynamic" way, those changes were actually performed in a rigid, fixed sort of way, and lacked the degrees of freedom for reallocating bandwidth within a chip of the present invention.

One of the motivations for the present invention is that in looking at the switching structures, the organization of switching fabrics and the behavior of switching elements within traditional switching fabrics (which come out of completely different disciplines than a person of ordinary skill in the art would encounter in chip design), it was discovered that the kinds of traffic models that a designer was apt to encounter in high-complexity devices are quite different than the canonical traffic models that are encountered in other disciplines. For example, Telco switching, Internet switching, video switching, storage-area networks, wide-area networks, ATM switching, local-area networks (LANs), and the like, which are the traditional sources of models for switching fabrics may not support the complex device the designer encountered in an optimal manner in most instances.

In order for this kind of approach to be truly effective in designing large-scale devices, with up to billions of components, this additional functionality is needed. It clearly applies in the case in which control the physical instantiation of the fabric is possible, due to the designer actually making the device and proceeding to fabrication. In other words, as opposed to the more general case, where a designer has to build for every contingency.

For example, once a designer has laid the infrastructure in place, it is fixed with respect to function and with respect to connectivity. The structure typically cannot be reallocated on the fly. However, when a designer is building the chip itself, every time a new chip is designed, a new fabric and infrastructure is provided. Thus, a designer has the luxury of being able to completely revisit a set of allocation optimizations and do the allocations differently in support of a different design.

In this way, the disaggregation of the links permits a designer to take isomorphic but discrepant allocations of connectivity and bandwidth and bring them into conjunction through reassessment of the link structures, and that is an elegant and powerful resolution of the optimization problem within these complex devices.

Thus, the present invention more fully addresses the problem than previous FPGA problem of mapping, which was specifically directed at the appropriate way of hooking up CLDs and resources on a FPGA. What was previously addressed was the purely structural aspect of it, as opposed to the present invention in which a designer may take a link set and abstract it completely and then use it as a basis for bringing the structure and the bandwidth into co-incidence. Typically, FPGA architectures are not concerned with that problem, and thus tend to approach it differently.

A variety of constraints may be provided to create a polynomial time solution to a particular routing problem as will be apparent to a person of ordinary skill in the art.

In exemplary embodiments, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

Although the invention has been described with a certain degree of particularity, it should be recognized that elements thereof may be altered by persons skilled in the art without departing from the spirit and scope of the invention. One of the embodiments of the invention can be implemented as sets of instructions resident in the memory of one or more information handling systems, which may include memory for storing a program of instructions and a processor for performing the program of instruction, wherein the program of instructions configures the processor and information handling system. Until required by the information handling system, the set of instructions may be stored in another readable memory device, for example in a hard disk drive or in a removable medium such as an optical disc for utilization in a CD-ROM drive and/or digital video disc (DVD) drive, a compact disc such as a compact disc-rewriteable (CD-RW), compact disc-recordable and erasable; a floppy disk for utilization in a floppy disk drive; a floppy/optical disc for utilization in a floppy/optical drive; a memory card such as a memory stick, personal computer memory card for utilization in a personal computer card slot, and the like. Further, the set of instructions can be stored in the memory of an information handling system and transmitted over a local area network or a wide area network, such as the Internet, when desired by the user.

Additionally, the instructions may be transmitted over a network in the form of an applet that is interpreted or compiled after transmission to the computer system rather than prior to transmission. One skilled in the art would appreciate that the physical storage of the sets of instructions or applets physically changes the medium upon which it is stored electrically, magnetically, chemically, physically, optically or holographically so that the medium carries computer readable information.

It is believed that the system and method of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A system, comprising:
   a plurality of platforms communicatively coupled utilizing an interconnect fabric; and
   a program of instructions suitable for being performed by the plurality of platforms, wherein the program of instructions configures the plurality of platforms to allocate bandwidth between platforms, wherein the program of instructions includes a protocol which determines a transmission process that a particular physical wire of the interconnect fabric is implicated in at a particular episode of time.

2. The system as described in claim 1, further comprising allocating bandwidth between a first platform and a second platform of the plurality of platforms that includes bandwidth that otherwise would not have been utilized by a third platform.

3. The system as described in claim 2, wherein the bandwidth is allocated on the basis of a virtualized arrangement of links based on bandwidth and a virtualized arrangement of links based on connectivity.

4. The system as described in claim 2, further comprising reallocating bandwidth at a second episode in time in a manner which is different from a previous allocation of bandwidth in the plurality of platforms at a first episode in time.

5. The system as described in claim 1, wherein a substantial portion of the plurality of platforms include switches which operate to direct traffic within the fabric interconnect.

6. The system as described in claim 5, wherein the switches of the substantial portion of the plurality of platforms are separate and apart from the respective platforms.

7. The system as described in claim 1, wherein the fabric is isochronous.

8. The system as described in claim 1, wherein a first set of platforms of the plurality of platforms follow a power-law distribution with respect to connectivity and a second set of platforms of the plurality of platforms follow a power-law distribution with respect to bandwidth, the first set of platforms being different than the second set of platforms.

9. A method for allocating connectivity and bandwidth of an integrated circuit, comprising:
   receiving an interconnect fabric description, the described interconnect fabric having a plurality of platforms linked over an isochronous interconnect fabric;
   virtualizing an arrangement of links of the received interconnect fabric based on bandwidth;
   virtualizing an arrangement of links of the received interconnect fabric based on connectivity;
   allocating the links based on the virtualized link arrangements based on bandwidth and connectivity; and
   reallocating bandwidth at a second episode in time in a manner which is different from a previous allocation of bandwidth in the plurality of platforms at a first episode in time.

10. The method as described in claim 9, wherein the links are allocated so that the plurality of platforms aggregate bandwidth between at least a portion of the platforms.

11. The method as described in claim 9, wherein bandwidth is allocated between a first platform and a second platform of the plurality of platforms that includes bandwidth that otherwise would not have been utilized by a third platform.

12. The method as described in claim 9, wherein a substantial portion of the plurality of platforms include switches which operate to direct traffic within the fabric interconnect.

13. The method as described in claim 12, wherein the switches of the substantial portion of the plurality of platforms are separate and apart from the respective platforms.

14. The method as described in claim 9, further comprising determining a transmission process that a particular physical wire of the interconnect fabric is implicated in at a particular episode of time.

15. The method as described in claim 9, wherein the fabric is isochronous.

16. The method as described in claim 9, wherein a first set of platforms of the plurality of platforms follow a power-law distribution with respect to connectivity and a second set of platforms of the plurality of platforms follow a power-law distribution with respect to bandwidth, the first set of platforms being different than the second set of platforms.

17. A method, comprising:
   receiving an interconnect fabric description, the described interconnect fabric having a plurality of platforms linked over an isochronous interconnect fabric;
   virtualizing an arrangement of links of the received interconnect fabric based on bandwidth;
   virtualizing an arrangement of links of the received interconnect fabric based on connectivity;
   allocating the links based on the virtualized link arrangements based on bandwidth and connectivity; and
   reallocating bandwidth at a second episode in time in a manner which is different from a previous allocation of bandwidth in the plurality of platforms at a first episode in time.

18. The method as described in claim 17, wherein bandwidth is allocated between a first platform and a second platform of the plurality of platforms that includes bandwidth that otherwise would not have been utilized by a third platform.

19. The method as described in claim 17, wherein the links are allocated so that the plurality of platforms aggregate bandwidth between at least a portion of the platforms.

20. The method as described in claim 17, wherein a substantial portion of the plurality of platforms include switches which operate to direct traffic within the fabric interconnect.

21. The method as described in claim 20, wherein the switches of the substantial portion of the plurality of platforms are separate and apart from the respective platforms.

22. The method as described in claim 17, further comprising determining a transmission process that a particular physical wire of the interconnect fabric is implicated in at a particular episode of time.

23. The method as described in claim 17, wherein the fabric is isochronous.

24. The method as described in claim 17, wherein a first set of platforms of the plurality of platforms follow a power-law distribution with respect to connectivity and a second set of platforms of the plurality of platforms follow a power-law distribution with respect to bandwidth, the first set of platforms being different than the second set of platforms.

* * * * *